United States Patent
Schauer (10) Patent No.: US 10,991,614 B2
(45) Date of Patent: Apr. 27, 2021

(54) SUSCEPTOR FOR HOLDING A SEMICONDUCTOR WAFER WITH AN ORIENTATION NOTCH DURING THE DEPOSITION OF A LAYER ON A FRONT SIDE OF THE SEMICONDUCTOR WAFER AND METHOD FOR DEPOSITING THE LAYER BY USING THE SUSCEPTOR

(71) Applicant: SILTRONIC AG, Munich (DE)

(72) Inventor: Reinhard Schauer, Laufen (DE)

(73) Assignee: Siltronic AG, Munich (DE)

( * ) Notice: Subject to any disclaimer, the term of this patent is extended or adjusted under 35 U.S.C. 154(b) by 0 days.

(21) Appl. No.: 16/606,894

(22) PCT Filed: Apr. 17, 2018

(86) PCT No.: PCT/EP2018/059726
§ 371 (c)(1),
(2) Date: Oct. 21, 2019

(87) PCT Pub. No.: WO2018/192902
PCT Pub. Date: Oct. 25, 2018

(65) Prior Publication Data
US 2020/0365443 A1 Nov. 19, 2020

(30) Foreign Application Priority Data

Apr. 20, 2017 (DE) .......................... 102017206671.7

(51) Int. Cl.
*H01L 21/687* (2006.01)
*C23C 16/458* (2006.01)

(52) U.S. Cl.
CPC .... *H01L 21/68735* (2013.01); *C23C 16/4585* (2013.01); *H01L 21/68785* (2013.01)

(58) Field of Classification Search
CPC ......... H01L 21/68735; H01L 21/68785; C23C 16/4585; C30B 25/12
See application file for complete search history.

(56) References Cited

U.S. PATENT DOCUMENTS

2007/0227441 A1* 10/2007 Narahara .............. C30B 23/063
117/84
2008/0118712 A1 5/2008 Schauer et al.
(Continued)

FOREIGN PATENT DOCUMENTS

CN 102751221 A 10/2012
DE 10 2011 007 682 A1 10/2012
(Continued)

*Primary Examiner* — Michael M Trinh
(74) *Attorney, Agent, or Firm* — Brooks Kushman P.C.

(57) ABSTRACT

A susceptor for holding a semiconductor wafer with an orientation notch during deposition of a layer on the wafer comprises a susceptor ring having a placement area for placing the semiconductor wafer in the edge region of a back side of the semiconductor wafer and a step-shaped outer delimitation of the susceptor ring adjoining the placement area. The susceptor has four positions at which the structure differs from the structure at four further positions, the spacing from one of the four positions to the next of the four positions being 90°, the spacing from one of the four positions to the next further position being 45°, one of the four positions being a notch position at which the structure of the susceptor differs from the structure of the susceptor at the three other positions of the four positions of the susceptor.

3 Claims, 6 Drawing Sheets (56) References Cited

U.S. PATENT DOCUMENTS

| | | | |
|---|---|---|---|
| 2009/0031954 A1* | 2/2009 | Nishikido | C23C 16/4581 |
| | | | 118/725 |
| 2010/0029066 A1 | 2/2010 | Miyashita | |
| 2012/0270407 A1* | 10/2012 | Werner | C23C 16/4585 |
| | | | 438/758 |
| 2013/0263779 A1 | 10/2013 | Pitney et al. | |
| 2015/0275395 A1* | 10/2015 | Kang | C30B 25/165 |
| | | | 118/728 |
| 2017/0117228 A1* | 4/2017 | Schauer | H01L 21/02634 |

FOREIGN PATENT DOCUMENTS

| | | |
|---|---|---|
| JP | 2013-051290 A | 3/2013 |
| KR | 20120112971 A | 10/2012 |

* cited by examiner

SUSCEPTOR FOR HOLDING A SEMICONDUCTOR WAFER WITH AN ORIENTATION NOTCH DURING THE DEPOSITION OF A LAYER ON A FRONT SIDE OF THE SEMICONDUCTOR WAFER AND METHOD FOR DEPOSITING THE LAYER BY USING THE SUSCEPTOR

CROSS REFERENCE TO RELATED APPLICATIONS

This application is the U.S. National Phase of PCT Appln. No. PCT/EP2018/059726 filed Apr. 17, 2018, which claims priority to German Application No. 10 2017 206 671.7 filed Apr. 20, 2017, the disclosures of which are incorporated in their entirety by reference herein.

BACKGROUND OF THE INVENTION

1. Field of the Invention

The invention relates to a susceptor for holding a semiconductor wafer with an orientation notch during the deposition of a layer on a front side of the semiconductor wafer. The invention also relates to a method for depositing the layer on a front side of a semiconductor wafer with an orientation notch by using the susceptor, the semiconductor wafer having a <100> orientation.

2. Description of the Related Art

US 2008/0118712 A1 describes a susceptor, comprising a susceptor ring and a susceptor base. The susceptor ring has a ledge for placing a semiconductor wafer in the edge region of the back side of the semiconductor wafer and is placed on the susceptor base for the purpose of depositing a layer on the front side of the semiconductor wafer. The placed semiconductor wafer is located in a pocket of the susceptor, the radius between the middle of the susceptor ring and the inner edge of the outer delimitation defining the radius of the pocket. The susceptor ring and the susceptor base form a two-part unit.

The susceptor ring and the susceptor base may also be formed as a one-part susceptor. US 2007/0227441 A1 describes such a susceptor, and this document draws attention to periodic fluctuations in the thickness of the epitaxial layer in the edge region of epitaxially coated semiconductor silicon wafers. The reason for this is the different growth rates at which the epitaxial layer grows, and which are related to the crystal orientation. In an edge region that adjoins the front side of the semiconductor wafer, crystal planes that have different crystal orientations are exposed. In the case of semiconductor wafers of monocrystalline silicon with <100> orientation, the crystal orientations change periodically along the circumference of the semiconductor wafer. There are four locations in the edge region, spaced apart respectively by 90° with <110> orientation, at which an epitaxial layer grows comparatively quickly, and four further locations, spaced apart respectively by 45° in relation to the other four locations, at which an epitaxial layer grows comparatively slowly. In order to make the thickness of the epitaxial layer more uniform in the edge region, US 2007/0227441 A1 proposes altering the structure of the susceptor with the period of the thickness fluctuations.

This teaching disregards the fact that semiconductor wafers for which the thickness fluctuations mentioned are considered to be problematic are provided with an orientation notch in the edge region. In the case of silicon semiconductor wafers with <100> orientation of the front side, the orientation notch is usually located at one of the four locations at which an epitaxial layer grows comparatively quickly and marks one of four <110> crystal directions. The orientation notch is occasionally also located 45° away from such a location and marks one of four <100> crystal directions.

The object of the present invention is to make allowance for the presence of the orientation notch and to provide suitably appropriate growth conditions at the locations mentioned in the edge region.

SUMMARY OF THE INVENTION

The objects of the invention are achieved by a susceptor for holding a semiconductor wafer with an orientation notch during the deposition of a layer on a front side of the semiconductor wafer, comprising a susceptor ring and a susceptor base, the susceptor ring comprising a placement area for placing the semiconductor wafer in the edge region of a back side of the semiconductor wafer and a step-shaped outer delimitation of the susceptor ring adjoining the placement area, wherein the susceptor has four positions at which the structure of the susceptor differs from the structure of the susceptor at four further positions, the spacing from one of the four positions to the next of the four positions being 90° and the spacing from one of the four positions to the next further position being 45°, one of the four positions being a notch position, at which the structure of the susceptor differs from the structure of the susceptor at the three other positions of the four positions of the susceptor.

DETAILED DESCRIPTION OF THE PREFERRED EMBODIMENTS

The susceptor ring and the susceptor base may be formed as a one-part unit or as a two-part unit. A two-part configuration is preferred, the susceptor base preferably consisting of graphite felt or of graphite felt that is coated with silicon carbide, or of graphite that is coated with silicon carbide, or of silicon carbide, and the susceptor ring preferably being of silicon carbide or some other material that is coated with silicon carbide. The other material is preferably graphite or silicon.

The susceptor ring comprises a placement area (ledge) for placing a semiconductor wafer in the edge region of the back side of the semiconductor wafer and a step-shaped outer delimitation adjoining the placement area. The placed semiconductor wafer is thus located in a pocket of the susceptor.

The placement area has a radial width and extends inwardly from the inner edge of the outer delimitation. The placement area is preferably formed as sloping down in the inward direction in an inner-lying partial region or completely.

The outer delimitation has a radial width that corresponds to the distance between the inner edge and an outer edge of the outer delimitation. The outer delimitation has an upper delimiting surface and a height at the inner edge that extends from the placement area up to the upper delimiting surface. At the inner edge and at the outer edge of the outer delimitation, the susceptor respectively has a thickness.

At four positions of the susceptor that are distributed over the circumference, the structure of the susceptor is different than the structure of the susceptor at four further positions of the susceptor that are distributed over the circumference. The four positions respectively have a spacing of 90° from the next of the four positions and respectively have a spacing of 45° from the next of the four further positions. In addition, the structure of the susceptor differs at three of the four positions from the structure at the fourth position, the notch position.

The structure of the susceptor preferably remains unchanged in the circumferential direction over a lateral extent of ±22.5° from three of the four positions. It is particularly preferred, however, to design the susceptor in such a way that the structural change in the circumferential direction begins in the direct proximity of three of the four positions, for example at a distance of no more than ±1°, and proceeds rapidly, preferably so quickly that the structure of the four further positions is already achieved at a distance of no more than ±5°.

The susceptor is used in a method for depositing a layer on a front side of a semiconductor wafer with an orientation notch. The semiconductor wafer has a <100> orientation, and the method comprises placing the semiconductor wafer on the placement area of the susceptor ring in such a way that the orientation notch and the notch position of the susceptor are arranged on a line that is directed toward the middle of the semiconductor wafer; and coating the front side of the semiconductor wafer in a single-wafer reactor.

The front side of the semiconductor wafer is the upper main surface of the semiconductor wafer, on which the epitaxial layer is deposited, for example the (100) surface. The orientation notch is an indentation in the edge region of the semiconductor wafer at the place where a <110> direction points away from the edge, that is to say at one of the locations at which the epitaxial layer grows comparatively quickly.

The semiconductor wafer preferably consists of silicon, germanium or a mixture of these elements. It may however also be an SOI wafer (silicon on insulator), a bonded semiconductor wafer or a substrate wafer that has already been coated with one or more epitaxial layers. The epitaxial layer preferably consists of silicon, germanium or a mixture of these elements, and possibly contains a dopant.

The semiconductor wafer may be sliced from a single crystal that was crystallized by the FZ method (float zone) or by the CZ method. The CZ method comprises immersing a seed crystal in a melt that is contained in a crucible, and raising from the melt the seed crystal and the single crystal crystallizing on it.

The semiconductor wafer has a diameter of at least 200 mm, preferably at least 300 mm.

The arrangement according to the invention of the semiconductor wafer on the placement area in combination with the structure of the susceptor provides adapted conditions for the growing of the epitaxial layer. Three of the four locations at which the epitaxial layer grows comparatively quickly correspond to three of the four positions of the susceptor. The fourth location, which corresponds to that location where the orientation notch is also located, corresponds to the fourth of the four positions of the susceptor, the notch position. The structure of the susceptor at the notch position differs from the structure of the susceptor at the three of the four positions of the susceptor. According to one refinement of invention, the structure of the susceptor at the notch position corresponds to the structure of the susceptor at the further four positions of the susceptor. According to another refinement of the invention, the structure at the fourth position of the susceptor is also a different structure than at the four further positions of the susceptor.

The features specified with regard to the embodiments set out above of the device according to the invention can be correspondingly applied to the method according to the invention. These and other features of the embodiments according to the invention are explained in the description of the figures and in the claims. The individual features can be realized either separately or in combination as embodiments of the invention. Furthermore, they can describe advantageous embodiments which are independently protectable.

LIST OF REFERENCE SIGNS USED

Figure 1:
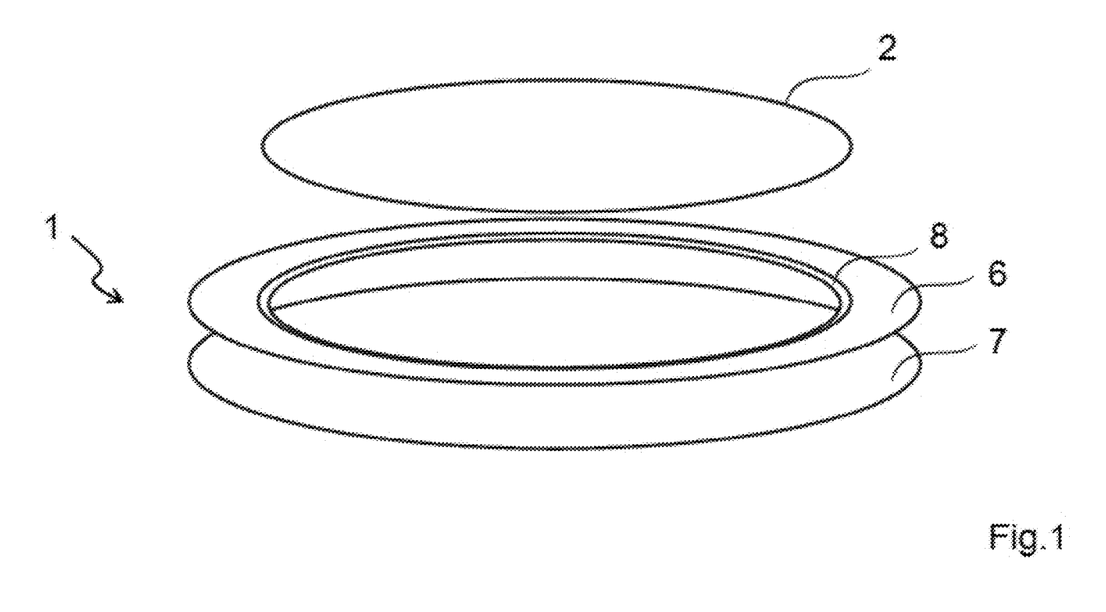
FIG. 1 shows a susceptor comprising a susceptor ring and a susceptor base.

1 Susceptor
2 Semiconductor wafer
3 Orientation notch of the semiconductor wafer
4 Layer
5 Outer edge of the semiconductor wafer
6 Susceptor ring
7 Susceptor base
8 Placement area of the susceptor ring
9 Inner edge of the placement area
10 Outer delimitation of the susceptor ring
11 Inner edge of the outer delimitation
12 Outer edge of the outer delimitation
13 Protuberance of the placement area
14 Protuberance of the outer delimitation FIG. 1 shows the relative arrangement of the susceptor base 7, the susceptor ring 6 and a semiconductor wafer 2 with an orientation notch 3. During use, the susceptor ring 6 lies on the susceptor base 7 and the semiconductor wafer 2 lies on a placement area 8 of the susceptor ring 6. The diameters of the susceptor base 7 and the susceptor ring 6 may be identical. The diameter of the susceptor base 7 may, however, also be greater than the diameter of the susceptor ring 6. As a departure from the representation, the susceptor ring 6 and the susceptor base 7 may also form a one-part unit.

Figure 2:
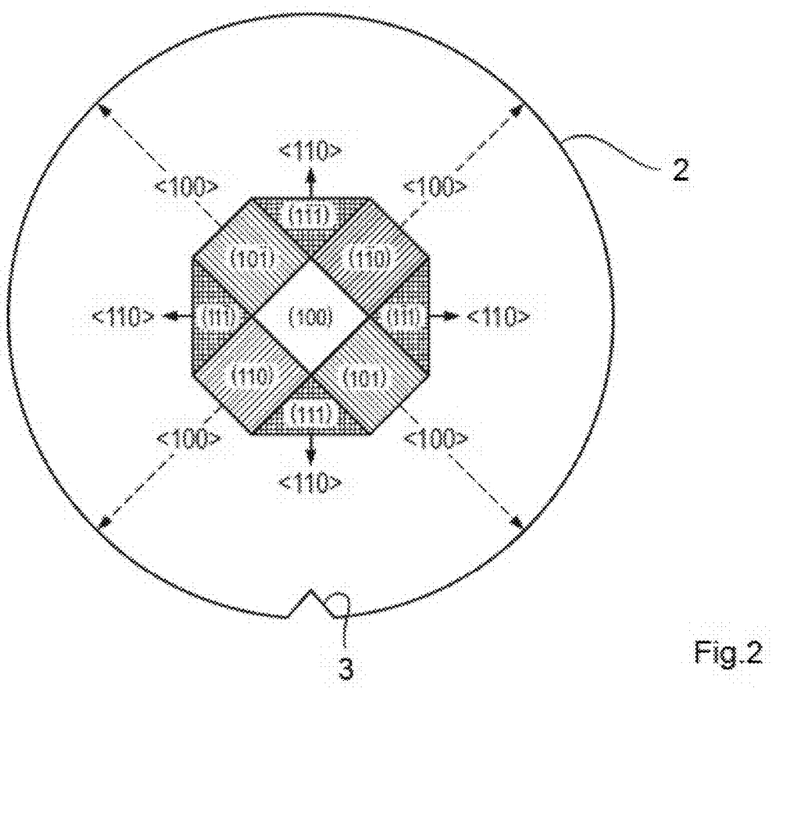
FIG. 2 shows a semiconductor wafer with <100> orientation in plan view.

FIG. 2 shows a semiconductor wafer 2 with an orientation notch 3. The semiconductor wafer 2 has a <100> orientation. The upper side surface of the semiconductor wafer 2 is for example the (100) plane. The orientation notch 3 marks one of four <110> crystal directions that point to corresponding planes in the region of the edge of the semiconductor wafer, distributed around the circumference of the semiconductor wafer spaced apart by 90°, on which an epitaxial layer grows with a comparatively higher rate than on planes in the region of the edge to which four <100> crystal directions point.

Corresponding thereto, a susceptor 1 according to the invention has four positions at which the structure of the susceptor differs from the structure that the susceptor has at four further positions. The spacing from one of the four positions to the next position is 90° and the spacing from one of the four positions to the next further position is 45°. In addition, the structure of the susceptor at one of the four positions differs from the structure that the susceptor has at the three other positions. This one position is referred to hereinafter as the notch position, because it is intended during the use of the susceptor to place a semiconductor wafer with <100> orientation on the placement area of the susceptor ring in such a way that its orientation notch 3 and the notch position are arranged on a line that is directed toward the middle of the semiconductor wafer.

Figure 3:
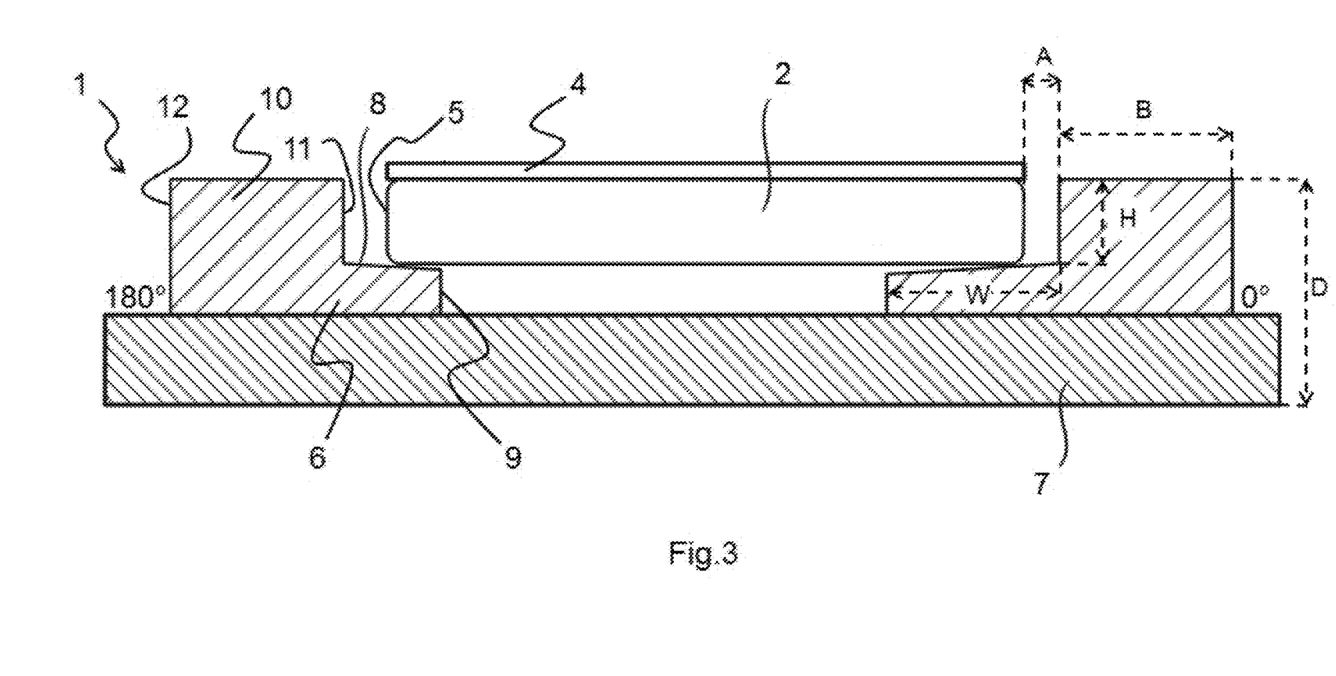
FIG. 3 and FIG. 4 show a susceptor and a semiconductor wafer placed on the placement area of the susceptor ring in vertical section.

FIG. 3 shows a susceptor 1 and a semiconductor wafer 2 placed on the placement area 8 of the susceptor ring 6 in vertical section. The vertical section passes through the notch position, identified by 0°, and through the position that lies opposite the notch position and is identified by 180°.

A first embodiment of a susceptor according to the invention provides that the distance A between the outer edge of the semiconductor wafer 5 and the inner edge 11 of the outer delimitation 10 of the susceptor ring 6 at the three of the four positions of the susceptor 1 is less than at the fourth position, the notch position, and is less than at the further four positions of the susceptor. At the notch position, the susceptor may have the same structure as at the further four positions, or have a structure that is additionally characterized by an inwardly directed protuberance of the placement area 13 (FIG. 5), or have a structure that is additionally characterized by the inwardly directed protuberance of the placement area 13 and by an inwardly directed protuberance of the outer delimitation 14 (FIG. 6).

A second embodiment of a susceptor according to the invention provides that the radial width W of the placement area 8 of the susceptor ring 6 at the three positions of the four positions of the susceptor 1 is less than at the fourth position, the notch position, and is less than at the further four positions of the susceptor. At the notch position, the susceptor may have the same structure as at the further four positions, or have a structure that is additionally characterized by an inwardly directed protuberance of the placement area 13 (FIG. 5), or have a structure that is additionally characterized by the inwardly directed protuberance of the placement area 13 and by an inwardly directed protuberance of the outer delimitation 14 (FIG. 6).

A third embodiment of a susceptor according to the invention provides that the height H of the outer delimitation of the susceptor ring at the three positions of the four positions of the susceptor 1 is greater than at the fourth position, the notch position, and is greater than at the further four positions of the susceptor 1. At the notch position, the susceptor may have the same structure as at the further four positions, or have a structure that is additionally characterized by an inwardly directed protuberance of the placement area 13 (FIG. 5), or have a structure that is additionally characterized by the inwardly directed protuberance of the placement area 13 and by an inwardly directed protuberance of the outer delimitation 14 (FIG. 6).

A fourth embodiment of a susceptor according to the invention provides that the thickness D of the susceptor 1 at the three positions of the four positions of the susceptor 1 is less than at the fourth position, the notch position, and less than at the further four positions of the susceptor 1. At the notch position, the susceptor may have the same structure as at the further four positions, or have a structure that is additionally characterized by an inwardly directed protuberance of the placement area 13 (FIG. 5), or have a structure that is additionally characterized by the inwardly directed protuberance of the placement area 13 and by an inwardly directed protuberance of the outer delimitation 14 (FIG. 6).

A fifth embodiment of a susceptor according to the invention provides that the radial width B of the outer delimitation of the susceptor ring 6 at the three positions of the four positions of the susceptor 1 is less than at the fourth position, the notch position, and less than at the further four positions of the susceptor. At the notch position, the susceptor may have the same structure as at the further four positions, or have a structure that is additionally characterized by an inwardly directed protuberance of the placement area 13 (FIG. 5), or have a structure that is additionally characterized by the inwardly directed protuberance of the placement area 13 and by an inwardly directed protuberance of the outer delimitation 14 (FIG. 6).

Figure 4:
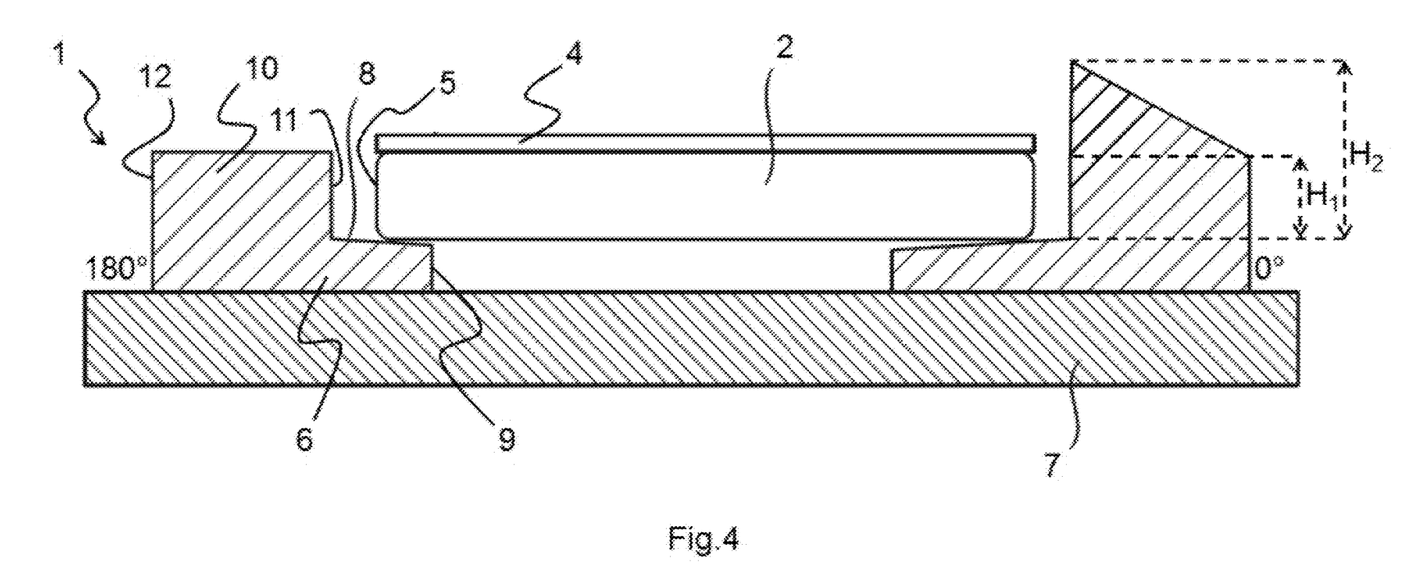

A sixth embodiment of a susceptor according to the invention provides that the outer delimitation 10 of the susceptor ring 6 at the three other positions of the four positions of the susceptor 1 decreases from the inner edge 11 of the outer delimitation 6 to the outer edge 12 of the outer delimitation 6 from a height $H_2$ to a height $H_1$, and stays at the height $H_1$ at the notch position of the susceptor 1 and the further four positions of the susceptor (FIG. 4). The height $H_2$ preferably reaches over the plane of the upper side surface of a semiconductor wafer lying on the placement area of the susceptor ring. At the notch position, the susceptor may have the same structure as at the further four positions, or have a structure that is additionally characterized by an inwardly directed protuberance of the placement area 13 (FIG. 5), or have a structure that is additionally characterized by the inwardly directed protuberance of the placement area 13 and by an inwardly directed protuberance of the outer delimitation 14 (FIG. 6).

Figure 5:
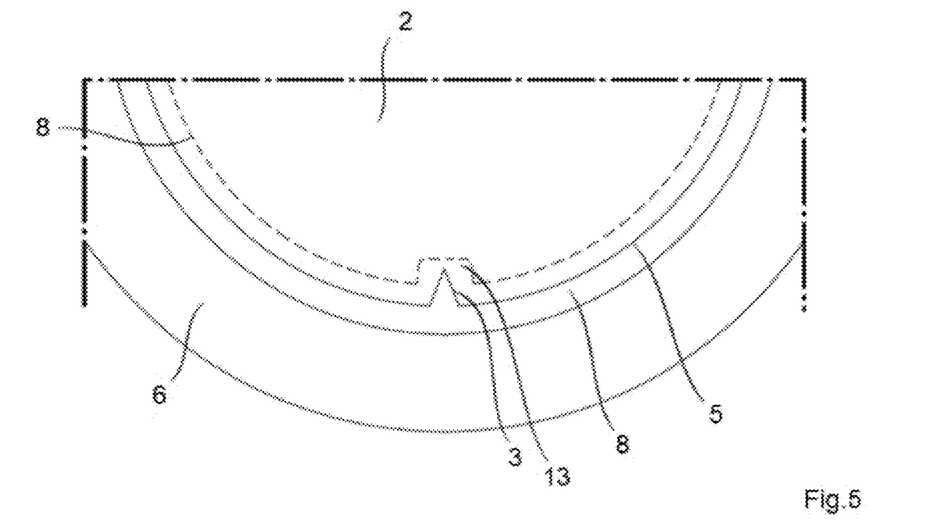
FIG. 5 shows a detail of the susceptor ring 6 and a semiconductor wafer 2 lying on the placement area 8 of the susceptor ring 6 in plan view.
Figure 6:
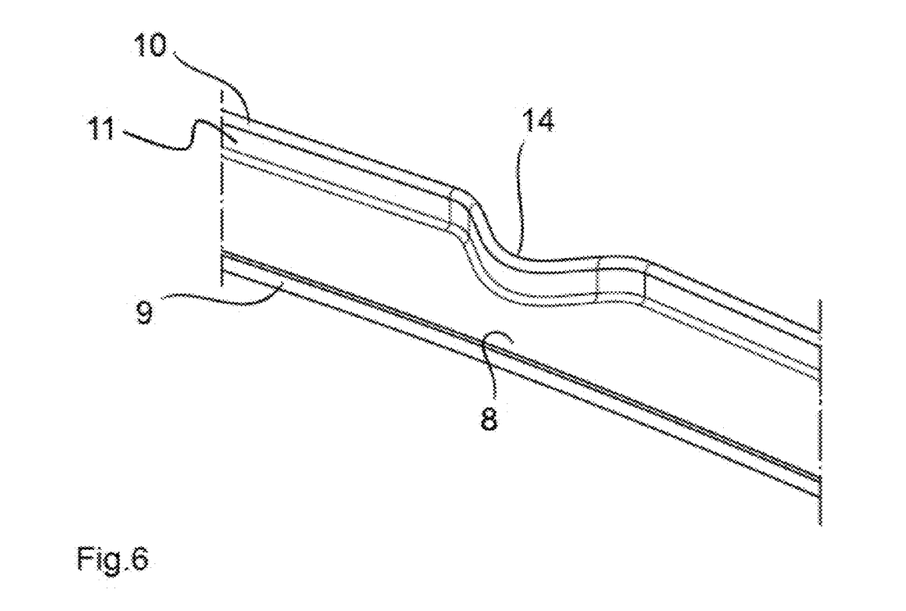
FIG. 6 shows the side view of part of the placement area and of the inner edge of the outer delimitation of a susceptor ring.

FIG. 5 shows a detail of the susceptor ring 6 and a semiconductor wafer 2 lying on the placement area 8 of the susceptor ring 6 in plan view. The region around the notch position of the susceptor is shown. The orientation notch 3 of the semiconductor wafer 2 may be underlaid by a protuberance 13 of the placement area 8 of the susceptor ring 6. In this case, without the protuberance 13, the orientation notch 3 would protrude inwardly beyond the inner edge of the placement area 8. In the regions outside the protuberance 13, that is to say also at the other three positions of the four positions and the further four positions of the susceptor 1, the radial width W of the placement area 8 is less than at the notch position.

FIG. 6 shows the side view of part of the placement area 8 and the inner edge 11 of the outer delimitation 10 of the susceptor ring 6. The region around the notch position of the susceptor is shown. At this position of the susceptor 1 there may be a protuberance 14 of the outer delimitation 10 in the inward direction. The protuberance 14 is preferably formed in such a way that it protrudes into the orientation notch 3 of a semiconductor wafer placed on the placement area 8.

The above description of exemplary embodiments should be understood as given by way of example. The disclosure made thereby firstly enables a person skilled in the art to understand the present invention and the advantages associated therewith, and secondly also encompasses obvious alterations and modifications of the structures and methods described within the understanding of the person skilled in the art. Therefore, all such alterations and modifications and also equivalents are intended to be covered by the scope of protection of the claims.

The above description considers the situation when the orientation notch marks one of four <110> crystal directions.

If the orientation notch marks one of four <100> crystal directions, one of the following conditions preferably applies instead:

a) in the state of a semiconductor wafer lying on the placement area, the distance A that there is between the outer edge of the semiconductor wafer and the inner edge of the outer delimitation of the susceptor ring at the three other positions of the four positions of the susceptor is greater than at the notch position of the susceptor and greater than at the further four positions of the susceptor;

b) the radial width W of the placement area of the susceptor ring at the three other positions of the four positions of the susceptor is greater than at the notch position of the susceptor and greater than at the further four positions of the susceptor;

c) the height H of the outer delimitation of the susceptor ring at the three other positions of the four positions of the susceptor is less than at the notch position of the susceptor and less than at the further four positions of the susceptor;

d) the thickness D of the susceptor at the three other positions of the four positions of the susceptor is greater than at the notch position of the susceptor and greater than at the further four positions of the susceptor;

e) the radial width B of the outer delimitation of the susceptor ring at the three other positions of the four positions of the susceptor is greater than at the notch position of the susceptor and greater than at the further four positions of the susceptor; and f) the outer delimitation of the susceptor ring stays at the height $H_1$ at the three other positions of the four positions of the susceptor from the inner edge of the outer delimitation to the outer edge of the outer delimitation, and decreases from the height $H_2$ to the height $H_1$ at the notch position of the susceptor and the further four positions of the susceptor.

Example

Semiconductor wafers of monocrystalline silicon with <100> orientation and a diameter of 300 mm were coated with an epitaxial layer of silicon in a single-wafer reactor. The thickness of the epitaxial layer was 2 µm. The susceptor was formed according to the sixth embodiment. The semiconductor wafers had an orientation notch marking a <110> direction and were placed onto the susceptor in such a way that the orientation notch and the notch position of the susceptor were arranged on a line that is directed toward the middle of the semiconductor wafer. In addition, there were on the susceptor at the notch position both a protuberance of the placement area in the inward direction and a protuberance of the outer delimitation in the inward direction.

With this configuration of the susceptor it was possible to achieve a flatness in the edge region, expressed as ESFQR-max and an edge exclusion of 1 mm, of no more than 150 nm. In particular, it was also possible in this way to suppress the occurrence of a growth on the back side of the semiconductor wafer in the region of the orientation notch, known as a "notch bump".

Figure 7:
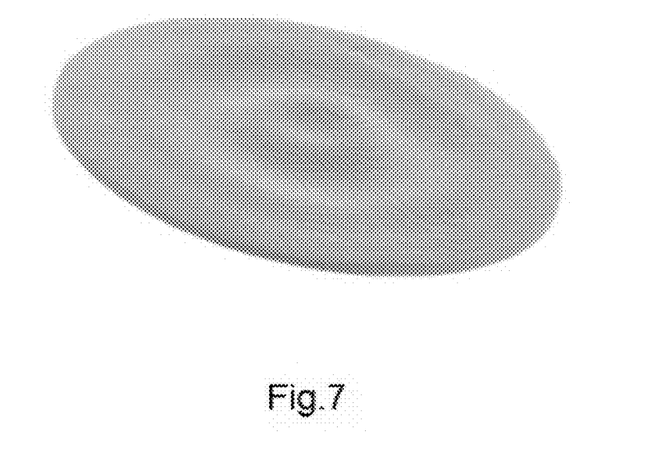
FIG. 7 and FIG. 8 show in each case the topography of the back side of semiconductor wafers after the deposition of an epitaxial layer on the front side.
Figure 8:
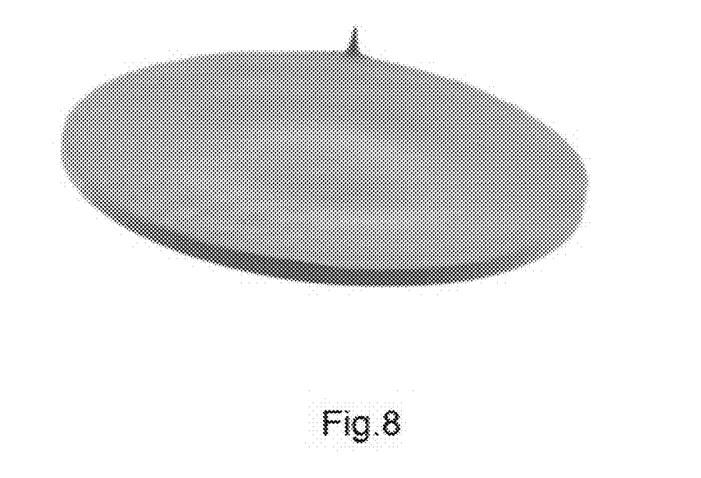

FIG. 7 shows the topography of the back side of such a semiconductor wafer and FIG. 8 shows by way of comparison that of a semiconductor wafer with a "notch bump" which could not be suppressed because the susceptor did not have the protuberances at the notch position.

The invention claimed is:

1. A susceptor for receiving a semiconductor wafer having an orientation notch during the deposition of a layer on a front side of the semiconductor wafer, comprising:

a susceptor ring and a susceptor base, the susceptor ring comprising a placement area for placing the semiconductor wafer in the edge region of a back side of the semiconductor wafer and a step-shaped outer delimitation of the susceptor ring adjoining the placement area, wherein the susceptor has four positions arranged radially at which the structure of the susceptor differs from the structure of the susceptor at four further positions arranged radially, the spacing from one of the four positions to the next of the four positions being 90° and the spacing from one of the four positions to the next further position being 45°, one of the four positions being a notch position at which the structure of the susceptor differs from the structure of the susceptor at the three other of the four positions of the susceptor, wherein at the notch position of the susceptor there is a protuberance of the placement area in an inward direction and a protuberance of the outer delimitation in the inward direction, and wherein either a) a radial width W of the placement area of the susceptor ring at the three other positions of the four positions of the susceptor is less than at the notch position of the susceptor and less than at the further four positions of the susceptor, or b) a height H of the outer delimitation of the susceptor ring at the three other positions of the four positions of the susceptor is greater than at the notch position of the susceptor and greater than at the further four positions of the susceptor, or c) a thickness D of the susceptor at the three other positions of the four positions of the susceptor is less than at the notch position of the susceptor and less than at the further four positions of the susceptor, or d) a radial width B of the outer delimitation of the susceptor ring at the three other positions of the four positions of the susceptor is less than at the notch position of the susceptor and less than at the further four positions of the susceptor, or e) the outer delimitation of the susceptor ring decreases from a height $H_2$ to a height $H_1$ at the three other positions of the four positions of the susceptor from the inner edge of the outer delimitation to the outer edge of the outer delimitation, and stays at the height $H_1$ at the notch position of the susceptor and the further four positions of the susceptor.

2. The susceptor of claim 1, wherein, in the state of a semiconductor wafer lying on the placement area, a distance A between an outer edge of the semiconductor wafer and an inner edge of the outer delimitation of the susceptor ring at the three other positions of the four positions of the susceptor is less than at the notch position of the susceptor and less than at the further four positions of the susceptor.

3. A method for depositing a layer on a front side of a semiconductor wafer with an orientation notch, the semiconductor wafer having a <100> orientation, comprising placing the semiconductor wafer on a susceptor ring of claim 1 such that the orientation notch and the notch position of the susceptor are arranged on a line that is directed toward the middle of the semiconductor wafer;

and coating the front side of the semiconductor wafer in a single-wafer reactor.

* * * * *